US011502236B1

(12) United States Patent
Bishop et al.

(10) Patent No.: US 11,502,236 B1
(45) Date of Patent: Nov. 15, 2022

(54) SYSTEMS AND METHODS FOR FORMING THIN BULK JUNCTION THERMOELECTRIC DEVICES IN PACKAGE

(71) Applicant: Apple Inc., Cupertino, CA (US)

(72) Inventors: Michael J. Bishop, San Carlos, CA (US); Gregory L. Tice, Los Altos, CA (US); Mario J. Costello, Santa Clara, CA (US); Reid A. Black, San Francisco, CA (US); Vijay M. Iyer, Mammoth Lakes, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/214,128

(22) Filed: Mar. 26, 2021

Related U.S. Application Data

(63) Continuation of application No. 15/873,767, filed on Jan. 17, 2018, now Pat. No. 10,964,873.
(Continued)

(51) Int. Cl.
*H01L 35/32* (2006.01)
*H01L 35/16* (2006.01)
(Continued)

(52) U.S. Cl.
CPC ......... *H01L 35/32* (2013.01); *G05D 23/1919* (2013.01); *H01L 35/16* (2013.01); *H01L 35/18* (2013.01); *H01L 35/34* (2013.01)

(58) Field of Classification Search
CPC .......... H01L 35/32; H01L 35/16; H01L 35/18
See application file for complete search history.

(56) References Cited

U.S. PATENT DOCUMENTS

| 4,907,060 | A | | 3/1990 | Nelson | |
|---|---|---|---|---|---|
| 5,209,786 | A | * | 5/1993 | Rolfe | H01L 35/32 136/211 |

(Continued)

FOREIGN PATENT DOCUMENTS

| JP | 2000163031 | 6/2000 |
|---|---|---|
| JP | 2000252527 | 9/2000 |
| JP | 2002342033 | 11/2002 |

OTHER PUBLICATIONS

Lee et al., "A Multi-Touch Three Dimensional Touch-Sensitive Tablet," Proceedings of CHI: ACM Conference on Human Factors in Computing Systems, Apr. 1985, pp. 212-225.
(Continued)

*Primary Examiner* — Errol V Fernandes
(74) *Attorney, Agent, or Firm* — Brownstein Hyatt Farber Schreck, LLP

(57) ABSTRACT

This disclosure relates to an integrated thermoelectric cooler and methods for forming thereof. The integrated thermoelectric cooler can include a plurality of thermoelectric rods located between the detector substrate and a system interposer. The detector substrate and the system interposer can directly contact ends of the thermoelectric rods. The integrated thermoelectric cooler can be formed by forming the plurality of thermoelectric rods on reels, for example, and the plurality of thermoelectric rods can be thinned down to a certain height. The thermoelectric rods can be transferred and bonded to the system substrate. An overmold can be formed around the plurality of thermoelectric rods. The height of the overmold and thermoelectric rods can be thinned down to another height. The thermoelectric rods can be bonded to the detector substrate. In some examples, the overmold can be removed.

18 Claims, 13 Drawing Sheets

Related U.S. Application Data

(60) Provisional application No. 62/466,989, filed on Mar. 3, 2017.

(51) Int. Cl.
*G05D 23/19* (2006.01)
*H01L 35/34* (2006.01)
*H01L 35/18* (2006.01)

(56) References Cited

U.S. PATENT DOCUMENTS

| | | | |
|---|---|---|---|
| 5,483,261 | A | 1/1996 | Yasutake |
| 5,488,204 | A | 1/1996 | Mead et al. |
| 5,825,352 | A | 10/1998 | Bisset et al. |
| 5,835,079 | A | 11/1998 | Shieh |
| 5,880,411 | A | 3/1999 | Gillespie et al. |
| 6,084,172 | A | 7/2000 | Kishi |
| 6,188,391 | B1 | 2/2001 | Seely et al. |
| 6,278,049 | B1 | 8/2001 | Johnson et al. |
| 6,310,610 | B1 | 10/2001 | Beaton et al. |
| 6,323,846 | B1 | 11/2001 | Westerman et al. |
| 6,690,387 | B2 | 2/2004 | Zimmerman et al. |
| 6,784,073 | B1 | 8/2004 | Fisher |
| 7,015,894 | B2 | 3/2006 | Morohoshi |
| 7,184,064 | B2 | 2/2007 | Zimmerman et al. |
| 7,663,607 | B2 | 2/2010 | Hotelling et al. |
| 8,479,122 | B2 | 7/2013 | Hotelling et al. |
| 9,087,962 | B2 | 7/2015 | Nakajima et al. |
| 9,638,442 | B2 | 5/2017 | Makansi et al. |
| 10,964,873 | B1 | 3/2021 | Bishop et al. |
| 2005/0139249 | A1 | 6/2005 | Ueki |
| 2006/0197753 | A1 | 9/2006 | Hotelling |
| 2010/0050658 | A1 | 3/2010 | Ali |
| 2016/0124167 | A1 | 5/2016 | Amirkiai et al. |
| 2016/0247996 | A1 | 8/2016 | Thomas |

OTHER PUBLICATIONS

Rubine, "The Automatic Recognition of Gestures," CMU-CS-91-202, Submitted in Partial Fulfillment of the Requirements for the Degree of Doctor of Philosophy in Computer Science at Carnegie Mellon University, Dec. 1991, 285 pages.

Rubine, "Combining Gestures and Direct Manipulation," CHI 1992, pp. 659-660.

Westerman, "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.

* cited by examiner

SYSTEMS AND METHODS FOR FORMING THIN BULK JUNCTION THERMOELECTRIC DEVICES IN PACKAGE

CROSS-REFERENCE TO RELATED APPLICATIONS

This application is a continuation of U.S. patent application Ser. No. 15/873,767, filed Jan. 17, 2018, which claims the benefit of U.S. Provisional Patent Application Ser. No. 62/466,989, filed Mar. 3, 2017, the entire disclosures of which are incorporated herein by reference for all purposes.

FIELD

This relates generally to thermoelectric devices in package, and more specifically, to integrated thermoelectric coolers and methods for forming thereof.

BACKGROUND

An integrated photonics system can include a plurality of optical components such as a detector (e.g., a detector array). To ensure high detector performance (e.g., high detectivity D*, low background noise, etc.), the detector array may need to be cooled. One type of cooling mechanism can be thermoelectric cooling. A thermoelectric cooler can be configured to stabilize the temperature of a detector array. For example, a thermoelectric cooler can ensure that the temperature of a detector array stays within ±5° C. from its temperature set point. The thermoelectric cooler can comprise a plurality of thermoelectric rods located between two substrates. One substrate can be thermally coupled to the detector array to allow heat transfer from the detector array to the thermoelectric cooler, and another substrate can be thermally coupled to the system substrate.

Another type of component included in the integrated photonics system can be an integrated circuit. The integrated circuit can include components such as light sources and integrated tuning elements disposed on the system substrate. In some instances, the plane of the detector substrate may be skewed relative to the plane of the system substrate. As a result, the integrated circuit may also be skewed relative to the detector substrate. A skew in planarity between the detector substrate and the system substrate can lead to measurement inaccuracies. In some instances (e.g., for compact, portable electronic devices), minimizing the dimensions of an integrated photonics system may be desired. Additionally or alternatively, it may be desirable to minimize the separation distances between components (e.g., the photonics integrated circuit and detector array) in the integrated photonics system.

SUMMARY

This relates to an integrated thermoelectric cooler and methods for forming thereof. The integrated thermoelectric cooler can include a plurality of thermoelectric rods located between the detector substrate and a system interposer. The detector substrate and the system interposer can directly contact ends of the thermoelectric rods. In some examples, one or more conductive materials can be located and in direct contact with the substrate(s) and the thermoelectric rods. The integrated thermoelectric cooler can be formed by forming the plurality of thermoelectric rods on reels, for example, and the plurality of thermoelectric rods can be thinned down to a certain height. The thermoelectric rods can be transferred and bonded to the system substrate. An overmold can be formed around the plurality of thermoelectric rods. The height of the overmold and thermoelectric rods can be thinned down to another height. The thermoelectric rods can be bonded to the detector substrate. In some examples, the overmold can be removed. The integrated thermoelectric cooler can also be formed by growing and patterning bulk semiconductor material to form a plurality of thermoelectric rods between substrates separate from the system and detector substrates. An overmold can be formed around the plurality of thermoelectric rods. One or more of the substrates can be removed, and an entire potted plurality of thermoelectric junctions can be transferred and integrated into the system.

DETAILED DESCRIPTION

Figure 1A:
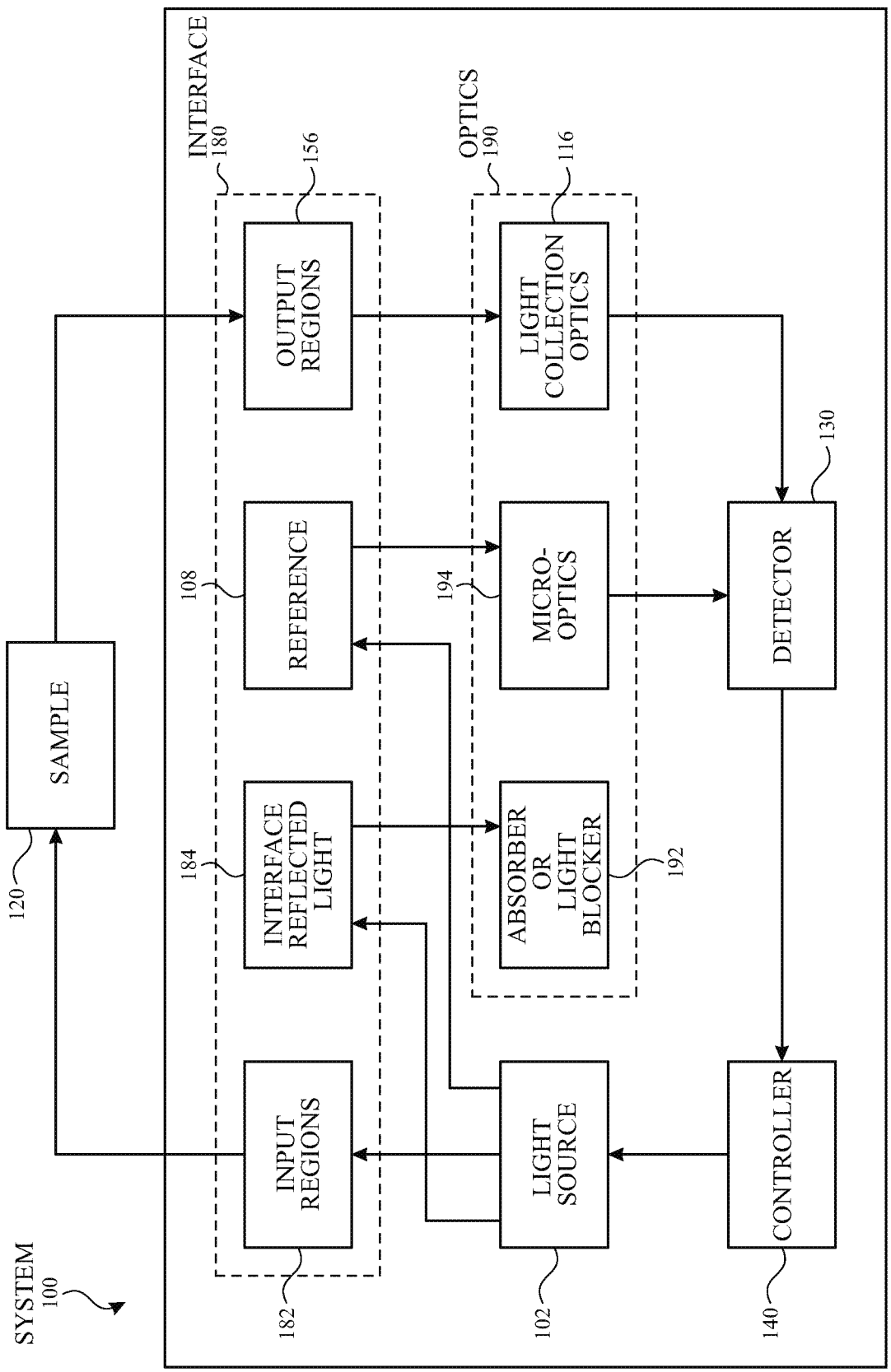
FIG. 1A illustrates a block diagram of an exemplary system capable of measuring one or more properties of a sample according to examples of the disclosure.

In the following description of examples, reference is made to the accompanying drawings in which it is shown by way of illustration specific examples that can be practiced. It is to be understood that other examples can be used and structural changes can be made without departing from the scope of the various examples.

Representative applications of methods and apparatus according to the present disclosure are described in this section. These examples are being provided solely to add context and aid in the understanding of the described examples. It will thus be apparent to one skilled in the art that the described examples may be practiced without some or all of the specific details. Other applications are possible, such that the following examples should not be taken as limiting.

Various techniques and process flow steps will be described in detail with reference to examples as illustrated in the accompanying drawings. In the following description, numerous specific details are set forth in order to provide a thorough understanding of one or more aspects and/or features described or referenced herein. It will be apparent, however, to one skilled in the art, that one or more aspects and/or features described or referenced herein may be practiced without some or all of these specific details. In other instances, well-known process steps and/or structures have not been described in detail in order to not obscure some of the aspects and/or features described or referenced herein.

An integrated photonics system can include a plurality of optical components such as a detector (e.g., a detector array). To ensure high detector performance (e.g., high detectivity D*, low background noise, etc.), the detector array may need to be cooled. One type of cooling mechanism can be thermoelectric cooling. Thermoelectric cooler can be configured to stabilize the temperature of detector array. For example, a thermoelectric cooler can ensure that the temperature of the detector array stays within ±5° C. from its temperature set point. The thermoelectric cooler can comprise a plurality of thermoelectric rods located between two substrates. One substrate can be thermally coupled to the detector array to allow heat transfer from the detector array to the thermoelectric cooler, and another substrate can be thermally coupled to the system substrate.

Another type of component included in the integrated photonics system can be an integrated circuit. The integrated circuit can include components such as light sources and integrated tuning elements disposed on the system substrate. In some instances, the plane of the detector substrate may be skewed relative to the plane of the system substrate. As a result, the plane of the integrated circuit may also be skewed relative to the plane of the detector substrate. A skew between the plane of the detector substrate and the plane of the system substrate can lead to measurement inaccuracies. In some instances (e.g., for compact, portable electronic device), minimizing the dimensions of an integrated photonics system may be desired. Additionally or alternatively, it may be desirable to minimize the separation distances between components (e.g., the photonics integrated circuit and detector array) in the integrated photonics system.

This relates to an integrated thermoelectric cooler and methods for forming thereof. The integrated thermoelectric cooler can include a plurality of thermoelectric rods located between the detector substrate and the system interposer. The detector substrate and the system interposer can directly contact ends of the thermoelectric rods. In some examples, one or more conductive materials can be located and in direct contact with the substrate(s) and the thermoelectric rods. The integrated thermoelectric cooler can be formed by forming the plurality of thermoelectric rods on reels, for example, and the plurality of thermoelectric rods can be thinned down to a certain height. The thermoelectric rods can be transferred and bonded to the system substrate. An overmold can formed around the plurality of thermoelectric rods. The height of the overmold and thermoelectric rods can be thinned down to another height. The thermoelectric rods can be bonded to the detector substrate. In some examples, the overmold can be removed. The integrated thermoelectric cooler can also be formed by growing and patterning bulk semiconductor material to form a plurality of thermoelectric rods between substrates separate from the system and detector substrates. An overmold can be formed around the plurality of thermoelectric rods. One or more of the substrates can be removed, and the entire potted plurality of thermoelectric junction can be transferred and integrated into the system.

Figure 1B:
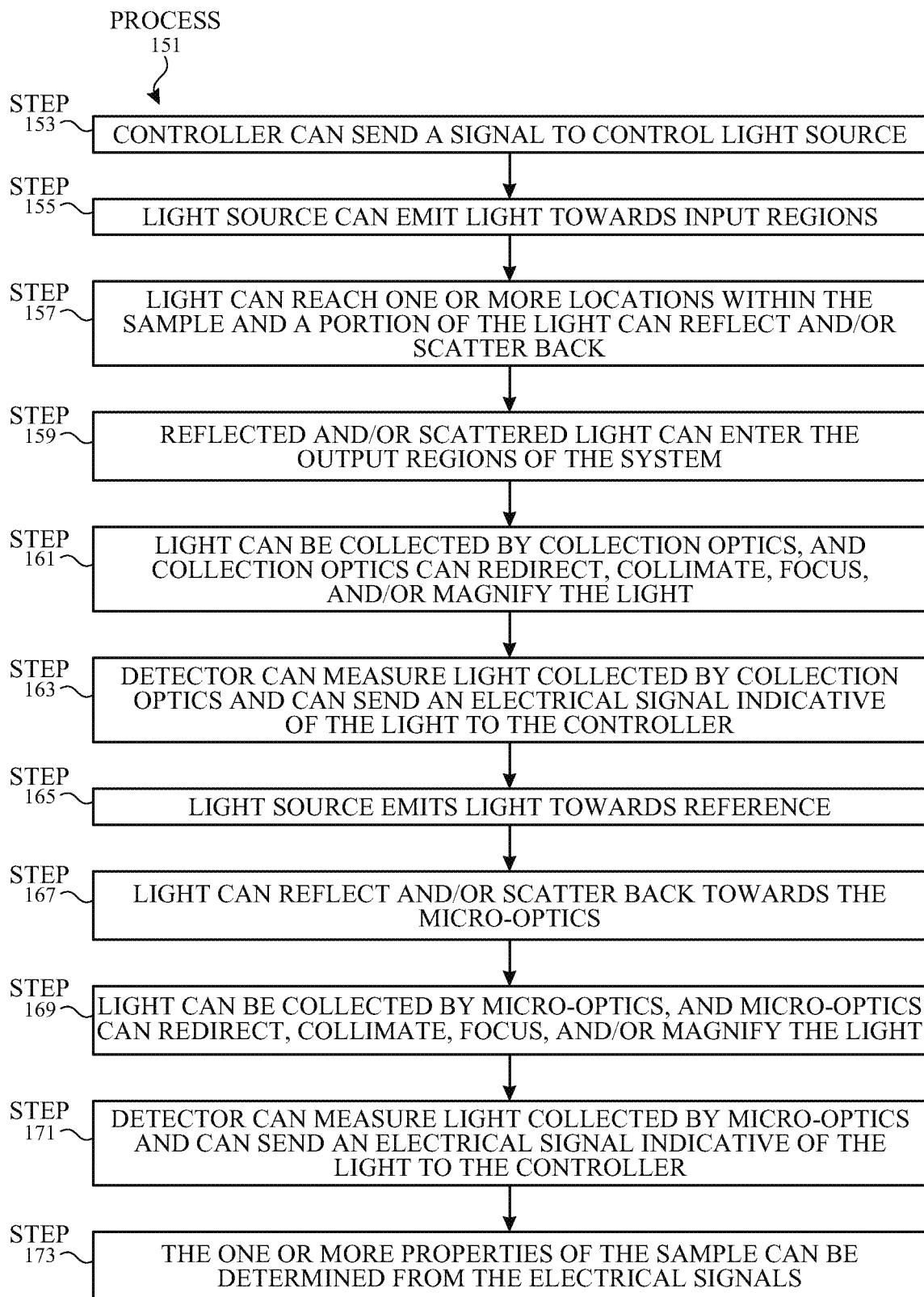
FIG. 1B illustrates an exemplary process flow for measuring one or more properties of a sample according to examples of the disclosure.

FIG. 1A illustrates a block diagram of an exemplary system and FIG. 1B illustrates an exemplary process flow for measuring one or more properties of a sample according to examples of the disclosure. System 100 can include interface 180, optics 190, light source 102, detector 130, and controller 140. Interface 180 can include input regions 182, interface reflected light 184, reference 108, and output regions 156. In some examples, input regions 182 and/or output regions 156 can include apertures configured to limit the location of sample 120 that is being measured. In some examples, input regions 182 and/or output regions 156 can include apertures configured to limit the angles of light entering and/or exiting sample 120. Optics 190 can include an absorber or light blocker 192, micro-optics 194 (e.g., a negative micro-lens), and light collection optics 116 (e.g., a positive microlens). Sample 120 can be located near, close to, or touching at least a portion of system 100. Light source 102 can be coupled to controller 140. Controller 140 can send a signal (e.g., current or voltage waveform) to control light source 102 to emit light towards the surface of sample 120 (step 153 of process 151). Depending on whether the system is measuring the one or more properties of the sample or of the reference, light source 102 can emit light towards input regions 182 (step 155 of process 151) or reference 108.

Input regions 182 can be configured to allow light to exit system 100 to be incident on sample 120. Light can penetrate a certain depth into sample 120 and can reflect and/or scatter back towards system 100 (step 157 of process 151). The reflected and/or scattered light can enter back into system 100 at output regions 156 (step 159 of process 151). The reflected and/or scattered light that enters back into system 100 can be collected by light collection optics 116, which can redirect, collimate, focus, and/or magnify the reflected and/or scattered light (step 161 of process 151). The reflected and/or scattered light can be directed towards detector 130. Detector 130 can detect the reflected and/or scattered light and can send an electrical signal indicative of the light to controller 140 (step 163 of process 151).

Light source 102 can, additionally or alternatively, emit light towards reference 108 (step 165 of process 151). Reference 108 can reflect light towards micro-optics 194 (step 167 of process 151). Reference 108 can include, but is not limited to, a mirror, a filter, and/or a sample with known optical properties. Micro-optics 194 can redirect, collimate, focus, and/or magnify light towards detector 130 (step 169 of process 151). Detector 130 can measure light reflected from reference 108 and can generate an electrical signal indicative of this reflected light (step 171 of process 151). Controller 140 can be configured to receive both the electrical signal indicative of light reflected/scattered from sample 120 and the electrical signal indicative of light reflected from reference 108 from detector 130. Controller 140 (or another processor) can determine one or more properties of the sample from the electrical signals (step 173 of process 151).

In some examples, when the system is measuring the one or more substances in the sample and in the reference, light emitted from the light source 102 can reflect off a surface of the sample back into system 100. Light reflected off the sample-system interface can be referred to as interface reflected light 184. In some examples, interface reflected light 184 can be light emitted from light source 102 that has not reflected off sample 120 or reference 108 (e.g., light that has not exited the system) and can be due to light scattering. Since interface reflected light 184 can be unwanted, absorber or light blocker 192 can prevent interface reflected light 184 from being collected by micro-optics 194 and light collection optics 116, which can prevent interface reflected light 184 from being measured by detector 130.

Figure 2:
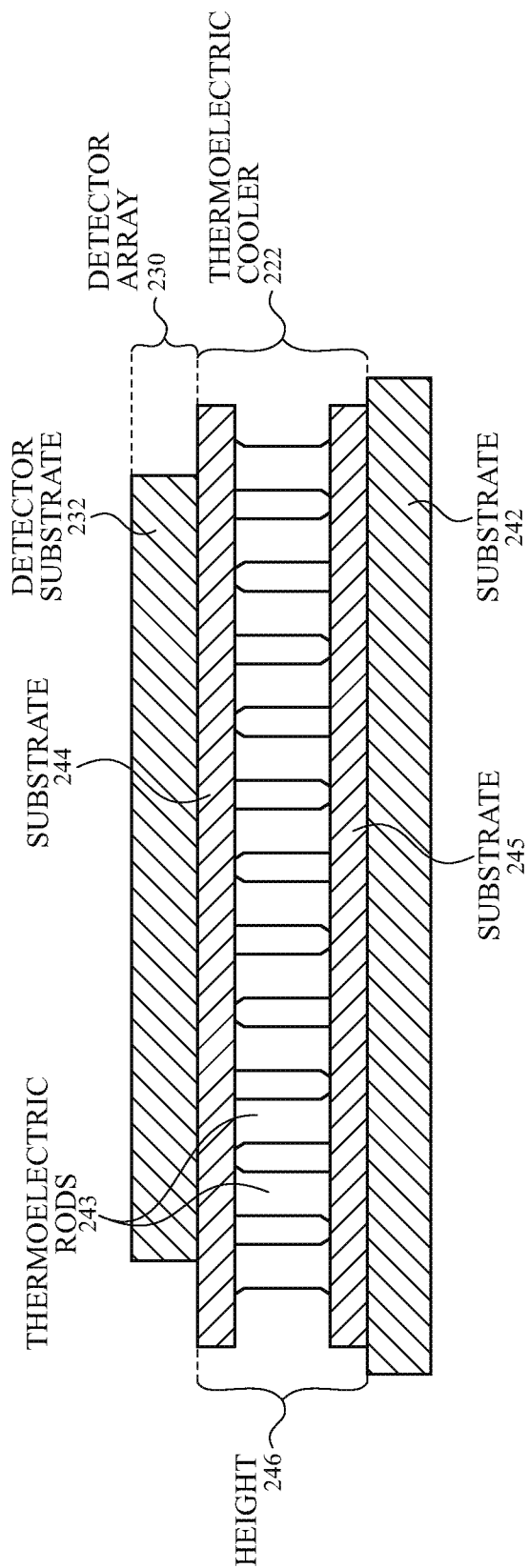
FIG. 2 illustrates a cross-sectional view of a detector array and a thermoelectric cooler included in a system according to examples of the disclosure.

FIG. 2 illustrates a cross-sectional view of a detector array and a thermoelectric cooler according to examples of the disclosure. Detector array 230 can be located in close proximity to thermoelectric cooler 222, which can be located in close proximity to substrate 242. Detector array 230 can include a plurality of detector pixels (not shown) located on detector substrate 232. To ensure high detector performance (e.g., high detectivity D*, low background noise, etc.), detector array 230 may need to be cooled. One type of cooling mechanism can be thermoelectric cooling. Thermoelectric cooler 222 can be configured to stabilize the temperature of detector array 230. For example, thermoelectric cooler 222 can ensure that the temperature of detector array 230 stays within ±5° from its temperature set point. Although the disclosure discusses the thermoelectric cooler 222 in the context of cooling, examples of the disclosure are not limited to systems and methods that lower the temperature of the detector array; examples of the thermoelectric cooler 222 can further include stabilizing the temperature of the detector array by way of heating, cooling, or both.

Thermoelectric cooler 222 can include a plurality of thermoelectric rods 243 located between substrate 244 and substrate 245. The total height of thermoelectric cooler 222 can be height 246. Thermoelectric rods 243 can include two semiconductors: one n-type semiconductor and one p-type semiconductor having different electron densities. Thermoelectric rods 243 can be vertically oriented (e.g., have greater longitudinal dimensions). Thermoelectric rods 243 can include any thermoelectric material including, but not limited to, bismuth telluride ($Bi_2Te_3$), bismuth selenide ($Bi_2Se_3$), lead telluride (PbTe), bismuth antimony, silicon germanium (SiGe), and the like. In some examples, ends of thermoelectric rods 243 can be in direct contact with substrate 244 and/or substrate 245. In some examples, thermoelectric rods 243 can be bonded to substrate 244 and/or substrate 245 by using one or more conductive materials. The one or more conductive materials can be configured to electrically connect thermoelectric rods (e.g., in series). For examples, the one or more conductive materials can include solder to electrically connect the thermoelectric rods and a metal trace to adhere the solder to the substrate 245. Substrate 244 and substrate 245 can include a thermally conducting and electrically insulating material such as silicon, ceramic, AN, and $Al_2O_3$.

In some instances, detector substrate 232 may be skewed (i.e., non-parallel) relative to substrate 242. As discussed above, the integrated circuit (e.g., including light sources 202, integrated tuning elements 204, optical traces 206, and/or multiplexer 208, as illustrated in FIG. 2) may be disposed on substrate 242. As a result, the plane of the integrated circuit may also be skewed relative to the plane of the detector substrate 232. Having a non-parallel detector substrate relative to the ejection point of the light emitted by light sources 202 can lead to measurement inaccuracies. As a point of reference, the skew of the ejection point of the light can be based on the skew of the substrate on which the light sources 202 and/or integrated tuning elements are located. Furthermore, the height 246 (e.g., 0.9-1.0 mm) of the thermoelectric cooler 222 can lead to a larger height of the overall system 200, which may not be suitable for compact portable electronic devices.

Figure 3A:
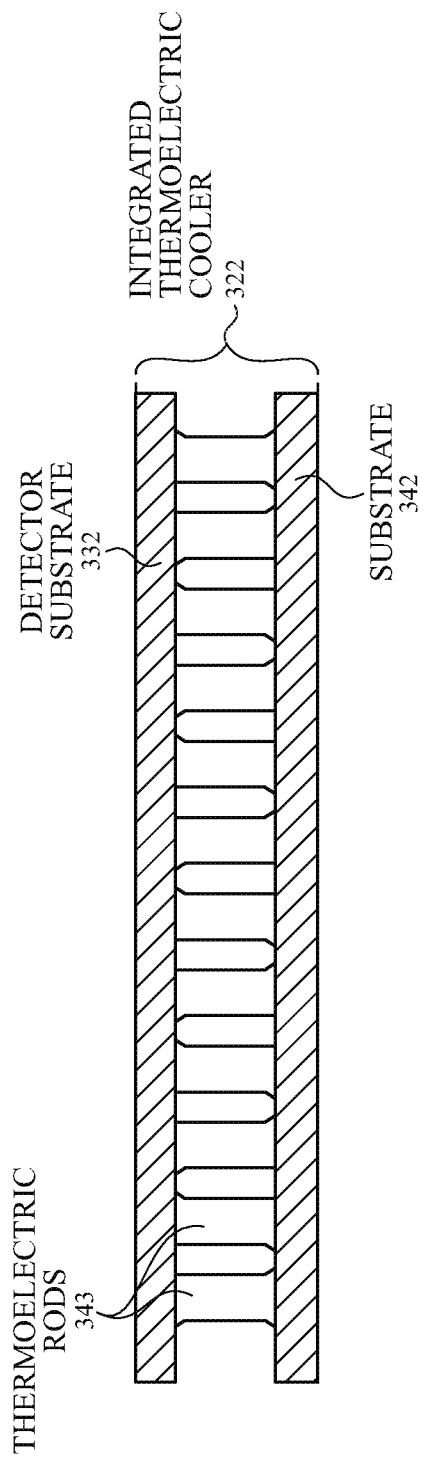
FIG. 3A illustrates a cross-sectional view of an exemplary integrated thermoelectric cooler according to examples of the disclosure.
Figure 3B:
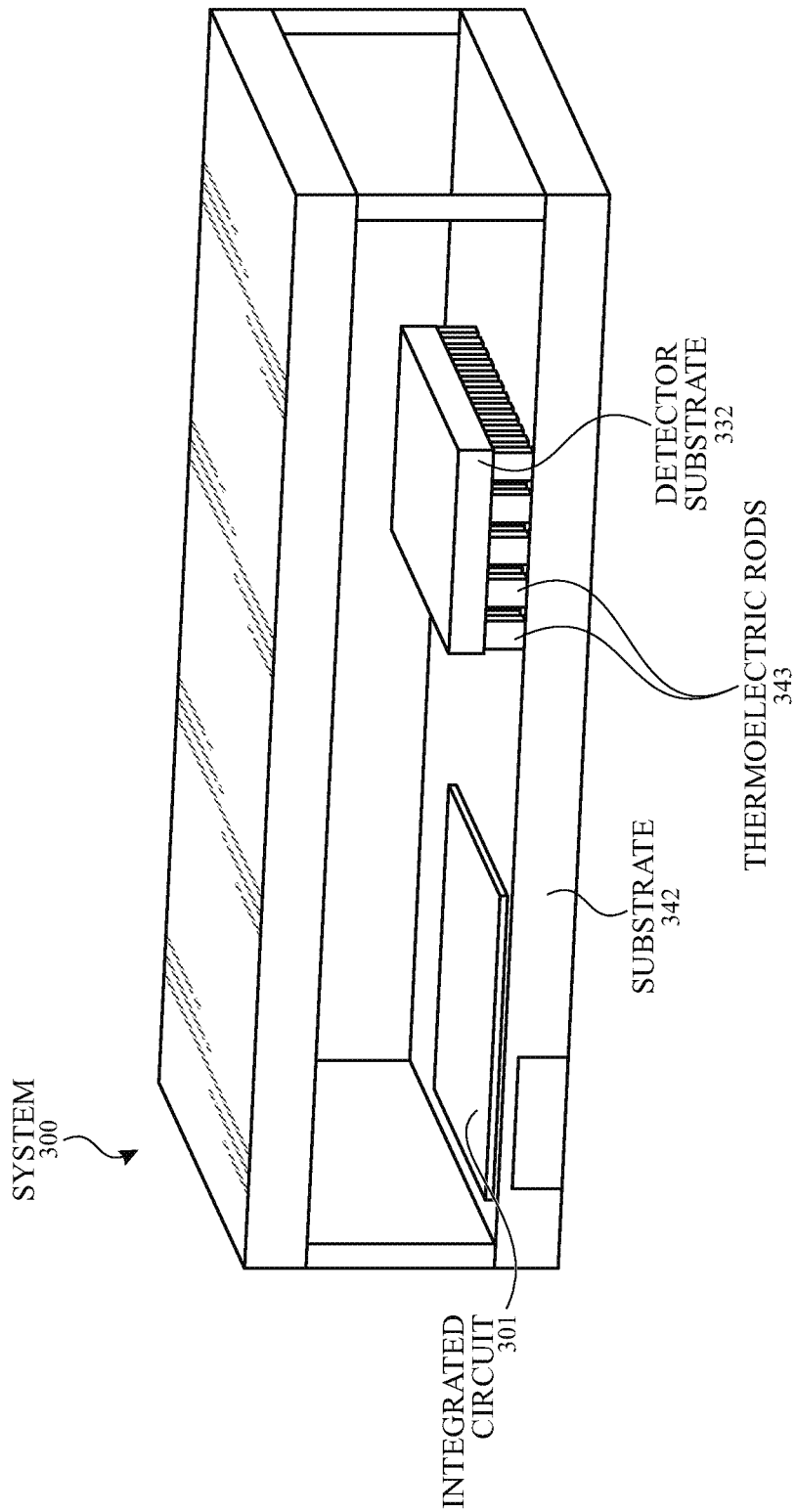
FIG. 3B illustrates a perspective view of an exemplary portion of an integrated photonics system including an integrated thermoelectric cooler according to examples of the disclosure.

To minimize the skew between the planes of the substrates and/or reduce the height of the thermoelectric cooler, the system can include an integrated thermoelectric cooler. FIG. 3A illustrates a cross-sectional view of an exemplary integrated thermoelectric cooler, and FIG. 3B illustrates a perspective view of an exemplary portion of an integrated photonics system including the integrated thermoelectric cooler according to examples of the disclosure.

System 300 can be close to, touching, resting on, or attached to a sample, located external to system 300. System 300 can include one or more layers of optics such as optics unit and micro-optics unit. Located below (i.e., opposite the surface of the sample) the layers of optics can be a detector array located on detector substrate 332. System 300 can also include integrated circuit 301.

Integrated circuit 301 can include light sources configured to emit light. The light sources can be any source capable of generating light including, but not limited to, a lamp, laser, light emitting diode (LED), organic light emitting diode (OLED), electroluminescent (EL) source, quantum dot (QD) light emitter, super-luminescent diode, super-continuum source, fiber-based source, or a combination of one or more of these sources. In some examples, the light sources can be capable of emitting a single wavelength of light. In some examples, the light sources can be capable of emitting a plurality of wavelengths of light. In some examples, the light sources can be any tunable source capable of generating a short-wave infrared (SWIR) signature. In some examples, each of the light sources can emit a different wavelength range of light (e.g., different colors in the spectrum). In some examples, the light sources can include a III-V material, such as Indium Phosphide (InP), Gallium Antimonide (GaSb), Gallium Arsenide Antimonide (GaAsSb), Aluminum Arsenide (AlAs), Aluminum Gallium Arsenide (AlGaAs), Aluminum Iridium Arsenide (AnnAs), Indium Gallium Phosphide (InGaP), Indium Gallium Arsenide (InGaAs), Indium Arsenide Antimonide (InAsSb), Indium Phosphide Antimonide (InPSb), Iridium Arsenide Phosphide Antimonide (InAsPSb), and Gallium Indium Arsenide Antimonide Phosphide (GaInAsSbP).

The integrated circuit 301 can further include components such as integrated tuning elements, optical traces, multiplexers, or the like. In some examples, the integrated tuning elements, the optical traces, and the multiplexer can be disposed on a substrate 342 or included in a single optical platform, such as a silicon photonics chip. Substrate 342 can be an interposer that provides an electrical interface between components integrated into the system. In this manner, the light sources, photonics integrated circuit, and detector can be co-packaged. Materials for substrate 342 can include, but are not limited to, aluminum nitride (AlN), aluminum dioxide (Al$_2$O$_3$), and silicon.

System 300 can also include a thermal management unit (not shown) for controlling, heating, or cooling the temperature of one or more optical components such as the light sources. Coupled to the multiplexer can be outcouplers. The outcouplers can optionally be configured to focus, collect, collimate, and/or condition (e.g., shape) the light beam from the multiplexers towards the optics. In some examples, the outcouplers can be configured as a single mode waveguide that directs a well-defined (i.e., directional) light beam towards the optics. In some examples, light from the outcouplers can be a light beam with a conical or cylindrical shape.

Integrated thermoelectric cooler 322 can include a plurality of thermoelectric rods 343 disposed between detector substrate 332 and substrate 342. Detector substrate 332 can be a substrate configured to support and/or attach to detector pixels. That is, detector substrate 332 can be a multifunctional substrate configured to support both the detector pixels and the plurality of thermoelectric rods 343. In some examples, detector substrate 332 can include silicon, ceramic, or Al$_2$O$_3$. Substrate 342 can be a substrate configured to support one or more components, such as integrated circuit 301. Substrate 342 can include any electrically insulating material including, but not limited to, ceramic, silicon, and Al$_2$O$_3$. In some examples, substrate 342 can have high thermal conductivity. For example, substrate 342 can have a thermal conductivity greater than or equal to 150 W/m-K. In some examples, substrate 342 can be an interposer. Thermoelectric rods 343 can include doped Bi$_2$Te$_3$, Bi$_2$Se$_3$, PbTe, bismuth antimony, and/or SiGe, for example. In some examples, ends of thermoelectric rods 343 can be in direct contact with detector substrate 332 and substrate 342. In some examples, thermoelectric rods 343 can be bonded to substrate 344 and/or substrate 345 by using one or more conductive materials. The one or more conductive materials can be configured to electrically connect thermoelectric rods (e.g., in series). For examples, the one or more conductive materials can include solder to electrically connect the thermoelectric rods and a metal trace to adhere the solder to the substrate 345. In some instances, the height of the thermoelectric rods 343 in the integrated thermoelectric cooler 322 can be less than the height of the thermoelectric rods in a non-integrated thermoelectric cooler. In some examples, the top (i.e., side closest to detector substrate 332) of the thermoelectric rods 343 may be level with respect to the plane of the detector substrate 332, substrate 342, one or more components integrated into the system, or a combination thereof. Ensuring levelness may include at least some of the thermoelectric rods 343 have different heights from other thermoelectric rods 343, the top of at least some of the thermoelectric rods 343 having angled (i.e., non-orthogonal relative to the sides of the thermoelectric rods) edges, or a combination thereof. For example, the top plane of the entire potted thermoelectric rods 343 may be slanted.

In some instances (e.g., for compact, portable electronic device), minimizing the dimensions of system 300 may be desired. Additionally or alternatively, it may be desirable to minimize the separation distances between components (e.g., the integrated circuit 301 and detector array located on detector substrate 332) in system 300.

Due to the reduction in height of the thermoelectric rods 343, the absence of a separate substrate(s) coupled to the thermoelectric rods (i.e., sharing of detector substrate 332 and/or sharing of substrate 342), or both, the height of the integrated thermoelectric cooler 332 can be less than the height of a non-integrated thermoelectric cooler. Furthermore, the removal of the separate substrate(s) can improve thermal performance due to removal of the bulk thermal resistance of the separate substrates and the extra solder interface. For example, the integrated thermoelectric cooler can ensure that the temperature of a detector array stays within ±0.1° C. from its temperature set point. In some examples, the integrated thermoelectric cool can ensure that the temperature of a detector array stays within ±0.01° C. from its temperature set point.

Figure 3C:
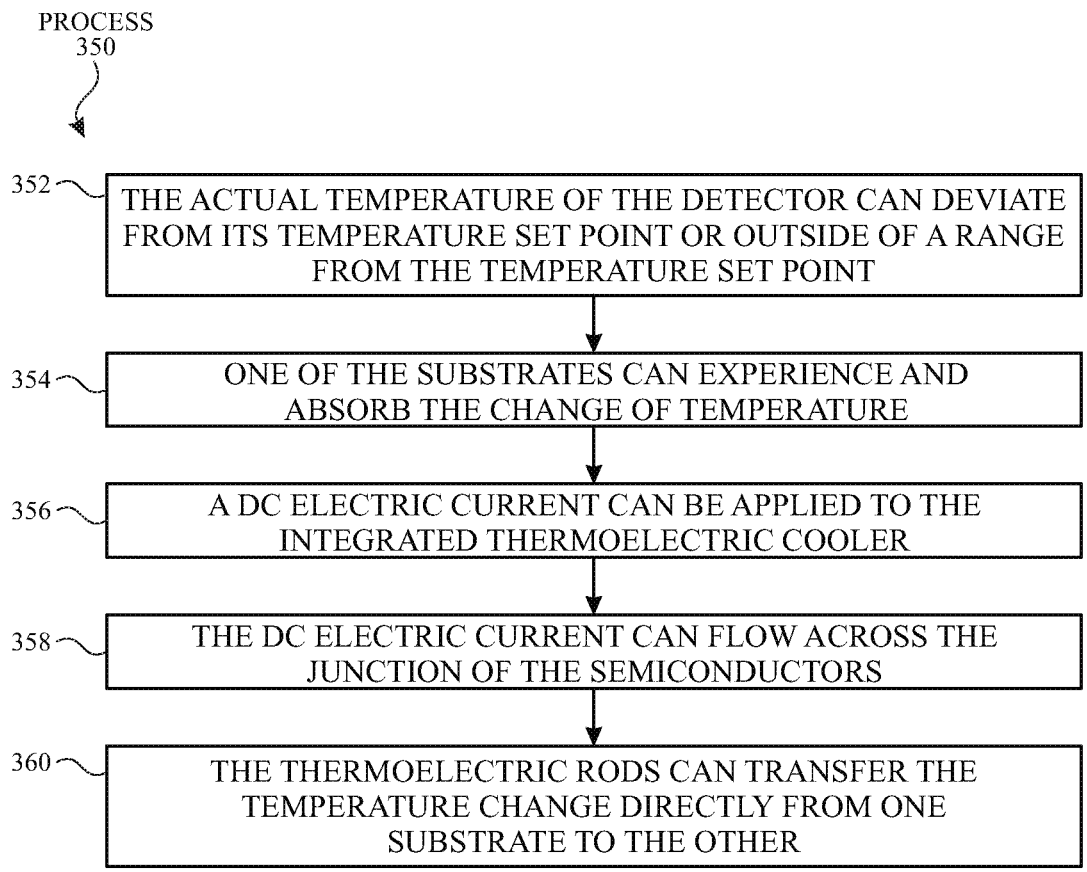
FIG. 3C illustrate an exemplary method for operating the integrated thermoelectric cooler according to examples of the disclosure.
Figure 3D:
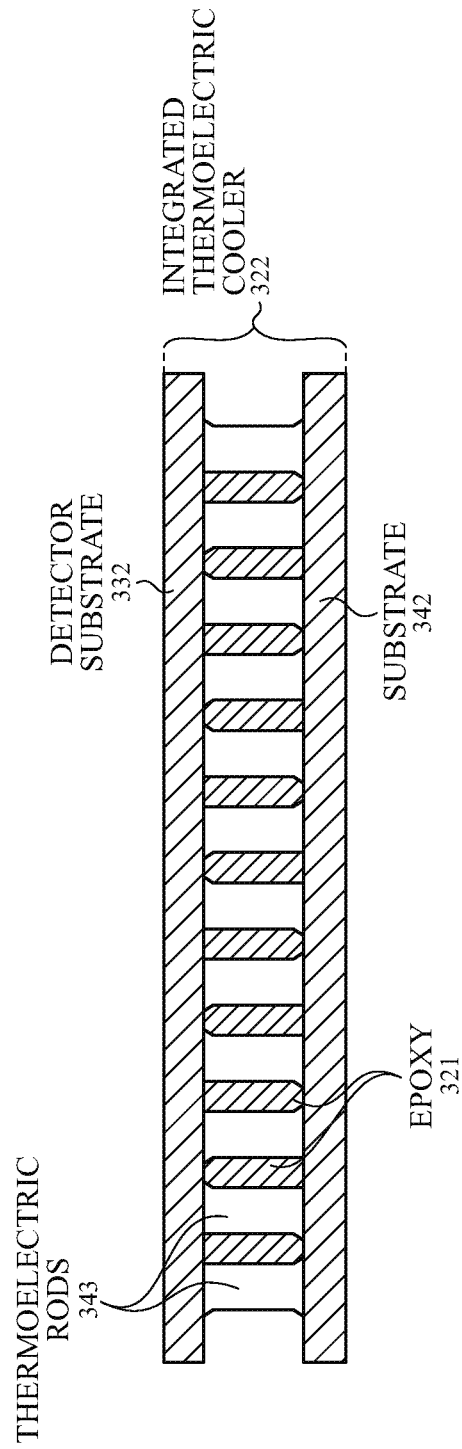
FIG. 3D illustrates a cross-sectional view of an exemplary integrated thermoelectric cooler including epoxy located between thermoelectric rods according to examples of the disclosure.

FIG. 3C illustrate an exemplary method for operating the integrated thermoelectric cooler according to examples of the disclosure. The actual temperature of the detector can deviate from its temperature set point or outside of a range from the temperature set point (step 352 of process 350). One of the substrates (e.g., detector substrate 332 illustrated in FIG. 3A) of the integrated thermal electric cooler can experience and absorb the change in temperature (e.g., heating) (step 354 of process 350). The integrated thermoelectric cooler (e.g., integrated thermoelectric cooler 322 illustrated in FIG. 3A) can be operated by routing an applied DC electric current through the substrate (e.g., substrate 342, which can be a system interposer) to the thermoelectric cooler (step 356 of process 350). The arrangement of the n-type and p-type semiconductors can be such that thermoelectric rods (e.g., thermoelectric rods 343) are thermally in parallel and electrically in series. The DC electric current can flow across the junction of the semiconductors (step 358 of process 350). The thermoelectric rods can transfer the temperature change directly from one substrate (e.g., detector substrate 332) to the other substrate (e.g., substrate 342) (step 360 of process 350). In some examples, one substrate can be attached to a heat removal/generation mechanism such as a heat sink.

Examples of the disclosure can include disposing a compound resin (e.g., an epoxy or wax) between the thermoelectric rods, as illustrated in FIG. 3C. Integrated thermoelectric cooler 322 can include epoxy 321 located between thermoelectric rods 343. The epoxy can be any suitable material configured to withstand (i.e., not melt) temperatures used during the bonding process of the thermoelectric rods to a substrate and with sufficient rigidity to withstand subsequent thinning. Sufficient rigidity could vary based on the type of material included in the thermoelectric rods, the specific methods used to thin the junctions, or both. The epoxy can be such that it is rigid enough (e.g., a Shore hardness between 70-90) to withstand the forces of the grinding or lapping process. In some examples, the epoxy may have a higher rigidity than room temperature vulcanization (RTV) silicone. Epoxy 321 can be an overmold used during the fabrication process, as discussed below, that may not be removed for purposes of condensation protection, to mitigate the effects from a mismatch in the coefficients of thermal expansion (e.g., between the thermoelectric rods, system interposer, and detector substrate), and/or to reduce manufacturing steps.

Figure 4A:
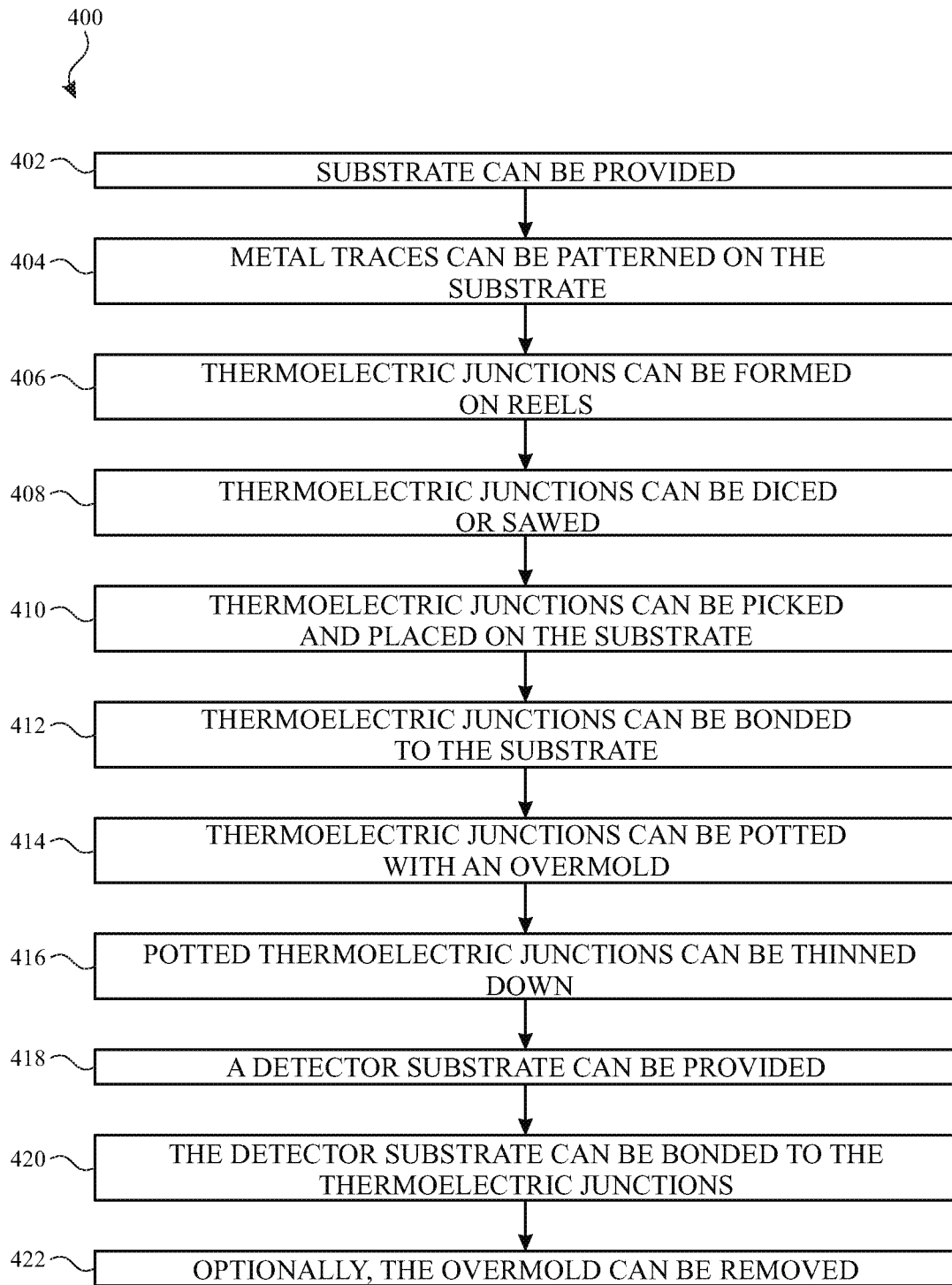
FIG. 4A illustrate an exemplary process flow for forming an integrated thermoelectric cooler according to examples of the disclosure.

FIG. 4A illustrates an exemplary process flow for fabricating an integrated thermoelectric cooler according to examples of the disclosure. A substrate (e.g., system interposer) can be provided (step 402 of process 400). Metal traces (e.g., metal solder) can be patterned on the substrate (step 404 of process 400). The pattern can be configured to electrically connect adjacent thermoelectric rods in series. The pattern can also include routing traces for routing power for the thermoelectric rods through the metal plane of the system interposer to the start and end of the thermoelectric junction path. The bulk thermoelectric rods can be formed on reels (step 406 of process 400). The thermoelectric rods can be configured with a certain height (e.g., height of 0.5 mm or greater) using dicing or sawing (step 408 of process 400), for example. In some examples, the bulk thermoelectric rods can be grown to be 500 [tm in height. Optionally, the bulk thermoelectric rods can be patterned following the growth step.

Figure 4B:
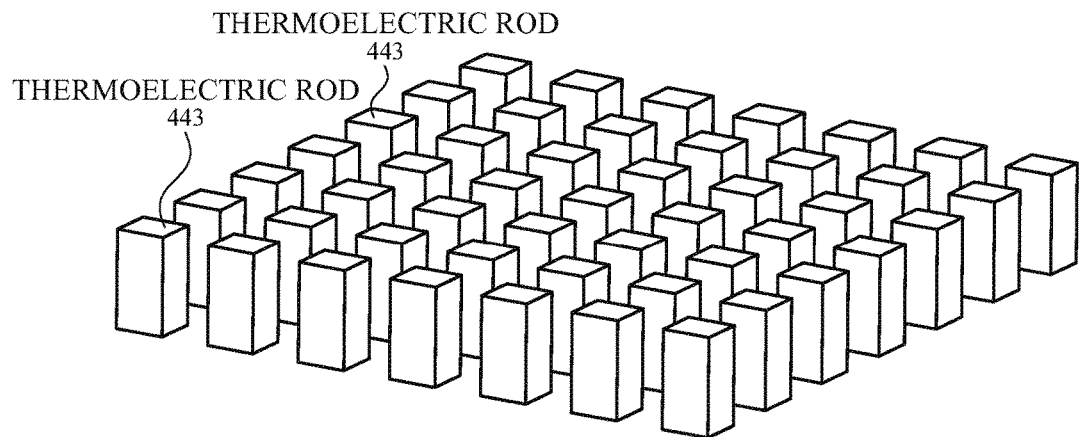
FIG. 4B illustrates a perspective view of thermoelectric rods picked and placed during fabrication of an integrated thermoelectric cooler according to examples of the disclosure.
Figure 4C:
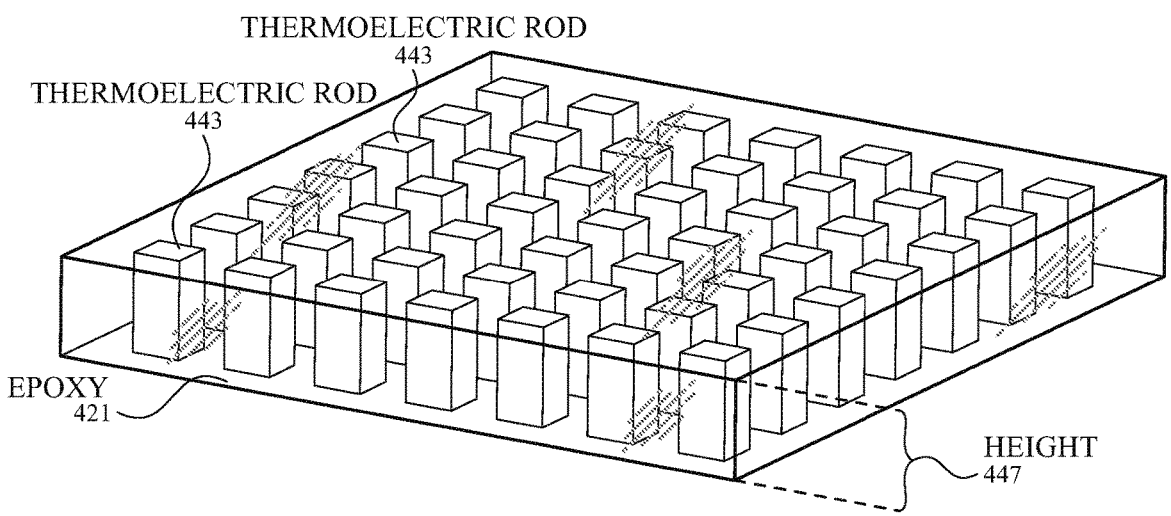
FIG. 4C illustrates a perspective view of potting thermoelectric rods in an overmold during fabrication of an integrated thermoelectric cooler according to examples of the disclosure.
Figure 4D:
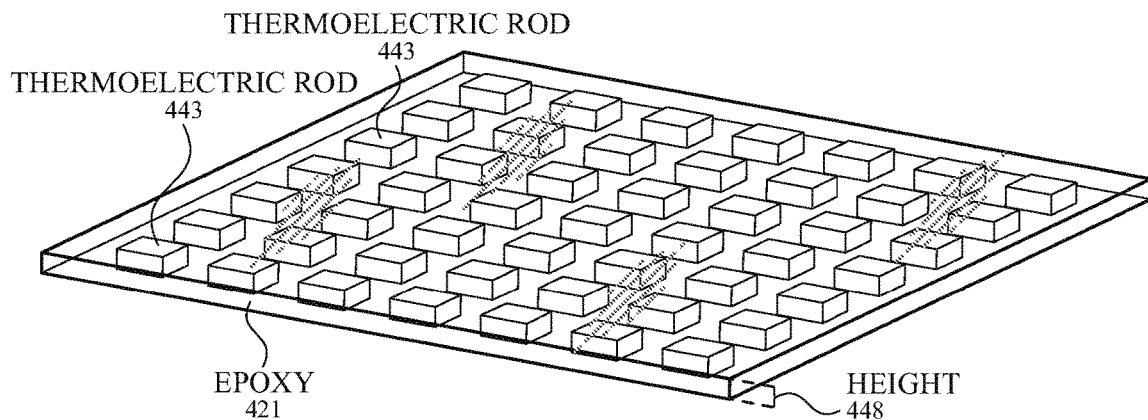
FIG. 4D illustrates a perspective view of thinning potted thermoelectric rods during fabrication of an integrated thermoelectric cooler according to examples of the disclosure.

FIGS. 4B-4D illustrate perspective views of the thermoelectric rods at various fabrication steps according to examples of the disclosure. Forming the thermoelectric rods on the substrate can include transferring (e.g., picking and placing) the thermoelectric rods (step 410 of process 400), as illustrated in FIG. 4B. In some examples, placing the thermoelectric rods can include aligning to match one or more fiducials located on the system substrate, detector substrate, or both. The thermoelectric rods can be bonded (e.g., using solder) to the substrate (step 412 of process 400). Bonding of the thermoelectric rods can be done at the wafer level (e.g., multiple systems and multiple thermoelectric coolers) or die level (e.g., single system and single thermoelectric cooler). The bonded thermoelectric rods can be prepared for a subsequent thinning step by being potted with an overmold (e.g., a compound resin such as epoxy or wax) (step 414 of process 400), for example, as illustrated in FIG. 4C. Potting can help reduce chipping or breakage among the thermoelectric rods and/or to prevent the thermoelectric rods from separating from the substrate (to which the thermoelectric rods are bonded in step 414). Thinning of the potted thermoelectric rods can be such that the level of the plane of the thermoelectric rods relative to the substrate, one or more components included in the system, (later bonded) detector substrate, or a combination thereof is maintained. Maintaining the levelness can include forming and/or thinning at least some of the thermoelectric rods to different heights, creating angled edges for at least some of thermoelectric rods, or both.

The height of the potted thermoelectric rods can be reduced with a thinning process (step 416 of process 400). For example, the potted thermoelectric rods can be ground down, polished, diced, or a combination thereof. In some examples, the potted thermoelectric rods can be thinned down, as illustrated in FIG. 4D, to a certain height (e.g., 100-400 μm), which can be based on the thermal performance required from the thermoelectric cooler to stabilize/cool the detector. Thinning of the potted thermoelectric rods can be done at the wafer level (e.g., multiple systems and multiple thermoelectric coolers) or die level (e.g., single system and single thermoelectric cooler). In some examples, thinning the potted thermoelectric rods can include leveling the top surface of the thermoelectric rods. The top surface of the thermoelectric rods can be leveled relative to the substrate. That is, the top surfaces of the thermoelectric rods can be formed such that the plane formed by the top surfaces is skewed relative to the plane of the substrate.

A detector substrate can be provided (step 418 of process 400). In some examples, the bottom surface (i.e., surface closer to the thermoelectric rods after bonding) of the detector substrate can include patterned conductive material. The patterned conductive material can be configured to electrically connect adjacent thermoelectric rods. The detector substrate can be bonded to the thermoelectric rods (step 420 of process 400). Optionally, the overmold (e.g., a compound resin such as epoxy or wax) can be removed (step 422 of process 400). Removal can include dissolving or melting the overmold.

Figure 4E:
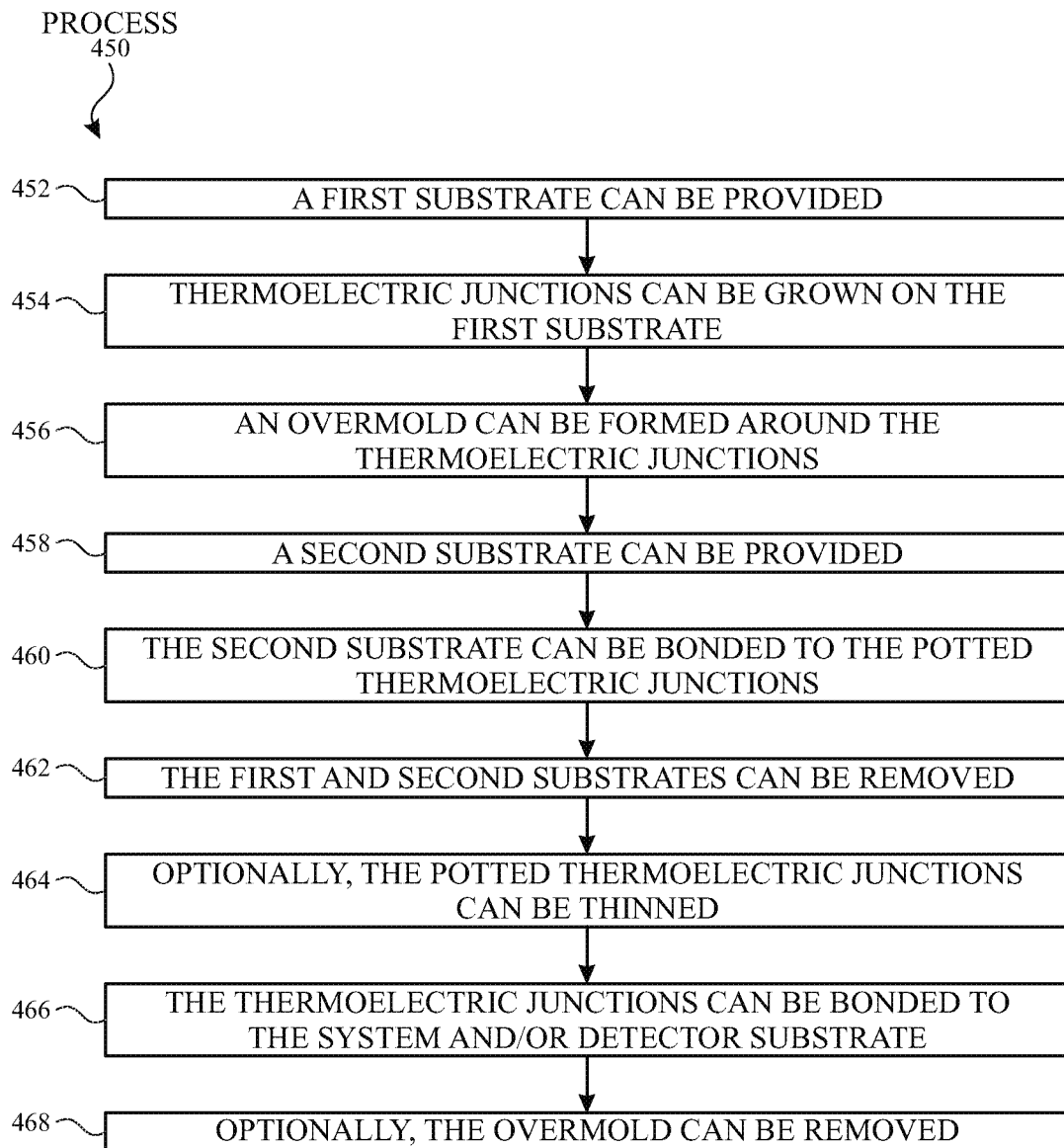
FIG. 4E illustrate an exemplary process flow for forming an integrated thermoelectric cooler according to examples of the disclosure.

In some examples, the thermoelectric rods can be formed on substrates separate from the detector substrate and/or interposer, and the substrates can be later removed, as illustrated in the exemplary process flow of FIG. 4E. A first substrate can be provided (step 452 of process 450). The thermoelectric rods can be grown on the first substrate (step 454 of process 450). An overmold can be formed around the thermoelectric rods (step 456 of process 450). A second substrate can be provided (step 458 of process 450). The second substrate can be bonded to the potted thermoelectric rods (step 460 of process 450). The first and second substrates can be removed (step 462 of process 450). Optionally, the potted thermoelectric rods can be thinned (step 464 of process 450). The plurality of thermoelectric rods and overmold can be bonded to the integrated photonics system and/or detector substrate (step 466 of process 450). Optionally, the overmold can be removed (step 468 of process 450).

Figure 4F:
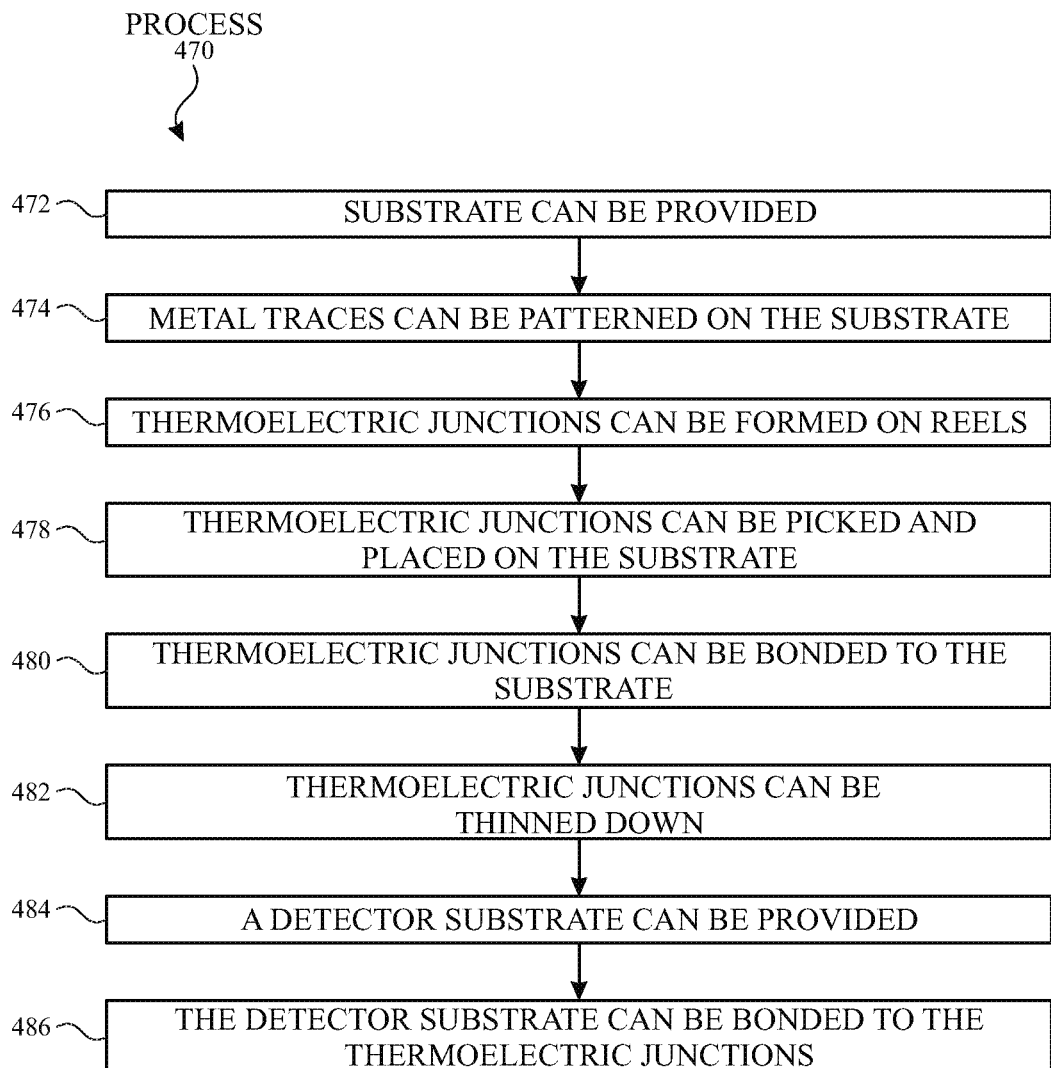
FIG. 4F an exemplary process flow for forming an integrated thermoelectric cooler without using an epoxy according to examples of the disclosure.

Examples of the disclosure can include forming the thermoelectric rods without using an epoxy. FIG. 4F illustrates an exemplary process flow for fabricating an integrated thermoelectric cooler without using an epoxy according to examples of the disclosure. A substrate (e.g., system interposer) can be provided (step 472 of process 470). Metal traces (e.g., metal solder) can be patterned on the substrate (step 474 of process 470). The pattern can be configured to electrically connect adjacent thermoelectric rods in series. The pattern can also include routing traces for routing power for the thermoelectric rods through the metal plane of the system interposer to the start and end of the thermoelectric junction path. The bulk thermoelectric rods can be formed on reels (step 476 of process 470). Optionally, the height of the thermoelectric rods can be configured while the thermoelectric rods are supported by the reels using, for example, dicing or sawing. The thermoelectric rods can be transferred (e.g., picking and placing) to the substrate (step 478 of process 470). The thermoelectric rods can be bonded (e.g., using solder) to the substrate (step 480 of process 470). Bonding of the thermoelectric rods can be done at the wafer level (e.g., multiple systems and multiple thermoelectric coolers) or die level (e.g., single system and single thermoelectric cooler).

The height of the thermoelectric rods can be reduced with a thinning process (step 482 of process 470). For example, the top surfaces of the thermoelectric rods can be ground down, polished, diced, or a combination thereof. Thinning of the thermoelectric rods can be done at the wafer level (e.g., multiple systems and multiple thermoelectric coolers) or die level (e.g., single system and single thermoelectric cooler). In some examples, thinning the thermoelectric rods can include leveling the top surface of the thermoelectric rods. The top surface of the thermoelectric rods can be leveled relative to the substrate. That is, the top surfaces of the thermoelectric rods can be formed such that the plane formed by the top surfaces has a certain skew (including a non-zero skew) relative to the plane of the substrate.

A detector substrate can be provided (step 484 of process 470). In some examples, the bottom surface (i.e., surface closer to the thermoelectric rods after bonding) of the detector substrate can include patterned conductive material. The patterned conductive material can be configured to electrically connect adjacent thermoelectric rods. The detector substrate can be bonded to the thermoelectric rods (step 486 of process 470).

As discussed above, one or more of the steps can be performed at the wafer level or die level. Examples of the disclosure can include one or more steps for separating (e.g., dicing) dies in order to performing some steps at the wafer level and subsequent steps at the die level. The fabrication steps discussed above can thereby achieve a thermoelectric cooler that has the height of thermoelectric rods grown by thin-film techniques but using bulk material growth techniques (e.g., doping of the thermoelectric rods). In this manner, co-packaging of the integrated photonics system and wafer level processing can be simplified and can lead to higher yields.

Figure 5:
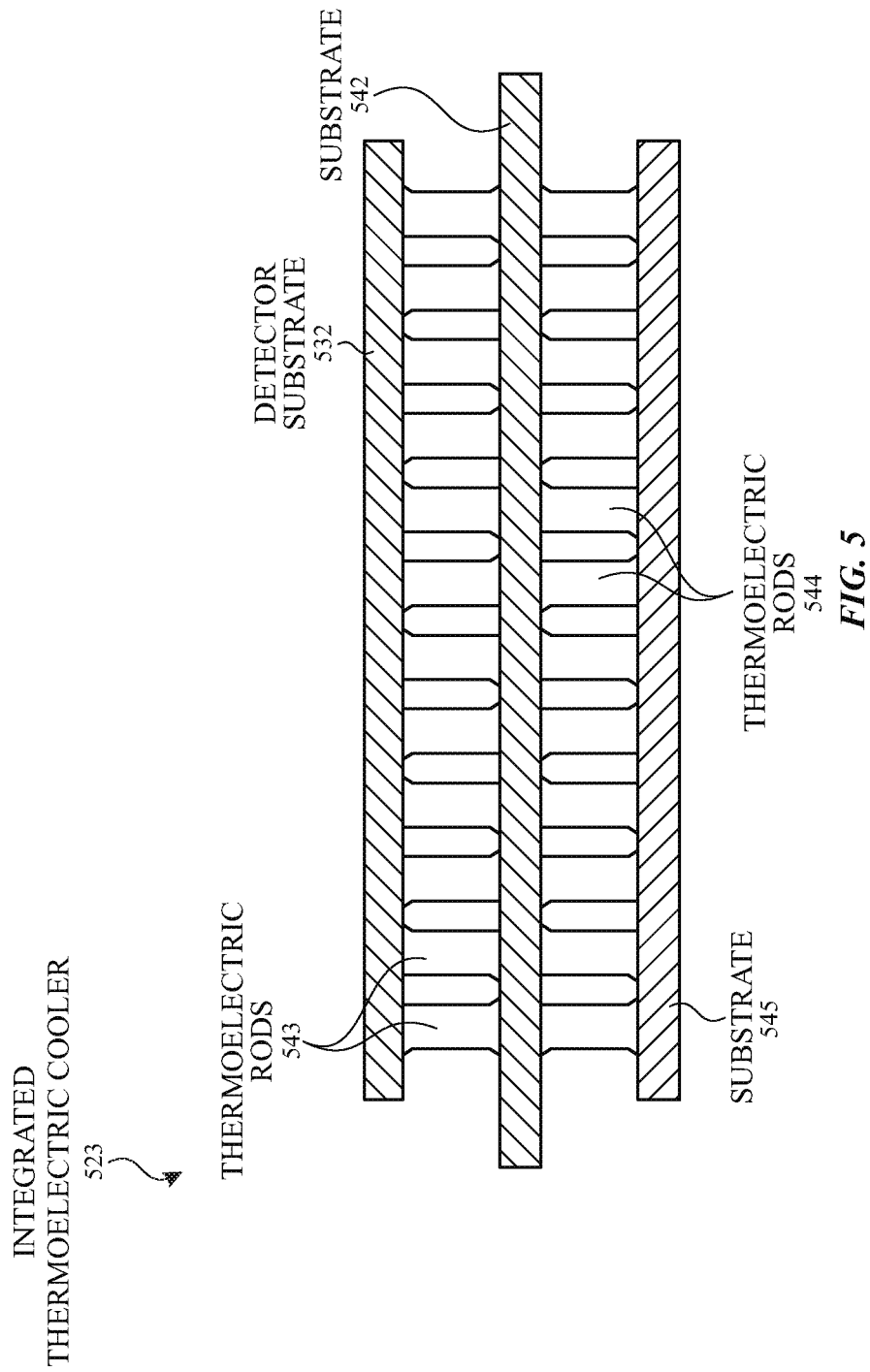
FIG. 5 illustrates a cross-sectional view of an exemplary double-sided integrated thermoelectric cooler according to examples of the disclosure.

Using the methods and systems described through this disclosure, a double-sided integrated thermoelectric cooler can be formed. FIG. 5 illustrates a cross-sectional view of an exemplary double-sided integrated thermoelectric cooler according to examples of the disclosure. Double-sided integrated thermoelectric cooler 523 can include a plurality of thermoelectric rods 543 disposed between detector substrate 532 and substrate 542. Detector substrate 532 can be a substrate configured to support and/or attach to detector pixels. That is, detector substrate 532 can be a multifunctional substrate configured to support both the detector pixels and the plurality of thermoelectric rods 543. In some examples, detector substrate 532 can include silicon, ceramic, or $Al_2O_3$. Substrate 542 can be a substrate configured to support one or more components (e.g., integrated circuit 301 illustrated in FIG. 3B). Substrate 542 can include any electrically insulating material including, but not limited to, ceramic, silicon, and $Al_2O_3$. In some examples, substrate 542 can have high thermal conductivity. For example, substrate 542 can have a thermal conductivity greater than or equal to 150 W/m-K. In some examples, substrate 542 can be an interposer.

Thermoelectric rods 543 can include doped $Bi_2Te_3$, $Bi_2Se_3$, PbTe, bismuth antimony, and/or SiGe, for example. In some examples, ends of thermoelectric rods 543 can be in direct contact with detector substrate 532 and substrate 542. In some examples, thermoelectric rods 543 can be bonded to substrate 544 and/or substrate 545 by using one or more conductive materials. The one or more conductive materials can be configured to electrically connect thermoelectric rods (e.g., in series). For examples, the one or more conductive materials can include solder to electrically connect the thermoelectric rods and a metal trace to adhere the solder to the substrate 545.

Double-sided integrated thermoelectric cooler 523 can further include a plurality of thermoelectric rods 544 disposed on between substrate 542 and substrate 545. Plurality of thermoelectric rods 543 can be disposed on a first side of substrate 542, while plurality of thermoelectric rods 544 can be disposed on a second side of substrate 542. In some examples, plurality of thermoelectric rods 544 can have one or more properties (e.g., material type) different from plurality of thermoelectric rods 543. In some examples, substrate 545 can be configured to support one or more components such as another detector array, light sources, or the like. Although the figure illustrates the plurality of thermoelectric rods 543 as "aligned" (i.e., located along the same x-, y-, and/or z-coordinates) with the plurality of thermoelectric rods 544, examples of the disclosure can include the plurality of thermoelectric rods 543 located in one or more different locations than plurality of thermoelectric rods 544. For examples, thermoelectric rods 543 can be offset or shifted, spaced different, differently sized, etc. Although the figure illustrates a single substrate 542, examples of the disclosure can include two or more substrates. For example, thermoelectric rods 543 can be disposed on a first substrate, and thermoelectric rods 544 can be disposed on a second substrate, with an adhesive between the first and second substrates.

Forming the plurality of thermoelectric rods 543 and the plurality of thermoelectric rods 544 on substrate 542 can include performing one or more method steps discussed above (e.g., picking and placing the thermoelectric junctions on the substrate in step 410 illustrated in FIG. 4A) on the respective thermoelectric junctions concurrently, even when the pluralities of thermoelectric junctions are formed on separate substrates. In some examples, the plurality of thermoelectric rods 543 can be formed before (or after) the plurality of thermoelectric rods 544 is formed. In some examples, one of the pluralities of thermoelectric rods can be formed followed by turning the substrate 542, and further followed by forming the other plurality of thermoelectric rods.

The plurality of second thermoelectric rods (e.g., thermoelectric rods 544) can be configured to stabilize or change (e.g., decrease) the temperature of substrate 542. Plurality of thermoelectric rods 544 can be electrically connected through substrate 542. In some examples, the plurality of first thermoelectric rods (e.g., thermoelectric rods 543) can be operated independent from the plurality of second thermoelectric rods (e.g., thermoelectric rods 544). As an exemplary function of the double-sided integrated thermoelectric cooler 523 can include stabilizing (e.g., cooling) the detector array using the thermoelectric rods 543. The substrate 542, which can be thermally coupled to thermoelectric rods 543, can be cooled (or heated) using thermoelectric rods 544. In this manner, temperature stability and/or the dynamic range of the operating temperature can be enhanced.

Figure 6A:
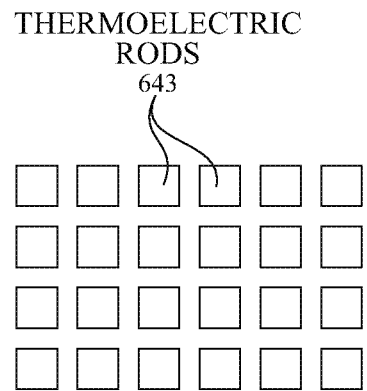
FIGS. 6A-6C illustrates top views of exemplary arrangements of thermoelectric rods according to examples of the disclosure.
Figure 6B:
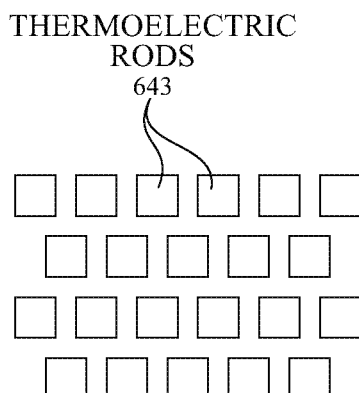
Figure 6C:
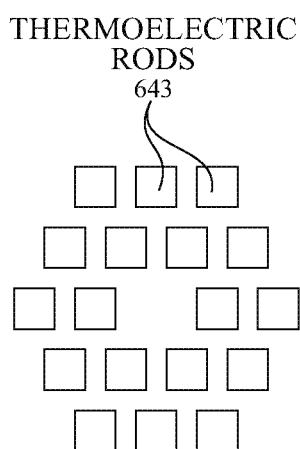

The integrated thermoelectric coolers disclosed above can include thermoelectric rods with various material properties. For example, as discussed above, different thermoelectric rods can have different sizes, spacing (i.e., non-uniform spacing), material types, etc., whether the thermoelectric rods are disposed on the same side or different sides of the same substrate or on different substrates. Additionally, the plurality of thermoelectric rods can be placed with any type of arrangement. FIGS. 6A-6C illustrates top views of exemplary arrangements of thermoelectric rods according to examples of the disclosure. Thermoelectric rods 643 can be arranged as a grid, having rows and columns of thermoelectric rods 643, as illustrated in FIG. 6A. In some examples, the columns of the thermoelectric rods 543 can be staggered, as illustrated in FIG. 6B. The locations of the thermoelectric rods 543 in adjacent rows can be offset. Examples of the disclosure can include a circular arrangement, as illustrated in FIG. 6C, a triangular arrangement, a square arrangement, etc. Examples of the disclosure can further include an asymmetrical arrangement. For example, the spacing between adjacent thermoelectric rods can gradually vary for thermoelectric rods located further from the integrated circuit (e.g., integrated circuit 301 illustrated in FIG. 3B).

A method for forming an integrated thermoelectric cooler is disclosed. The method can comprise: providing a substrate; forming a plurality of thermoelectric rods; bonding the plurality of thermoelectric rods to the substrate; surrounding the plurality of thermoelectric rods in an overmold; providing a detector substrate; and bonding the plurality of thermoelectric rods to the detector substrate. Additionally or alternatively, in some examples, the method further comprises: disposing one or more of an optical component and an integrated circuit on the substrate. Additionally or alternatively, in some examples, the method further comprises: disposing a thermal interface material on the substrate, wherein bonding the plurality of thermoelectric rods to the substrate includes locating the thermal interface material between the plurality of thermoelectric rods and the substrate, the thermal interface directly contacting the plurality of thermoelectric rods and the substrate. Additionally or alternatively, in some examples, the method further comprises: disposing a thermal interface material on the plurality of thermoelectric rods, wherein bonding the plurality of thermoelectric rods to the detector substrate includes locating the thermal interface material between the plurality of thermoelectric rods and the detector substrate, the thermal interface directly contacting the plurality of thermoelectric rods and the detector substrate. Additionally or alternatively, in some examples, forming the plurality of thermoelectric rods includes disposing the plurality of thermoelectric rods on another substrate. Additionally or alternatively, in some examples, the method further comprises: transferring the plurality of thermoelectric rods from the another substrate to the substrate by: removing the plurality of thermoelectric rods on the another substrate; and placing the plurality of thermoelectric rods on the substrate. Additionally or alternatively, in some examples, the method further comprises: forming an overmold around the plurality of thermoelectric rods. Additionally or alternatively, in some examples, the method further comprises: thinning a height of the plurality of thermoelectric rods and the overmold. Additionally or alternatively, in some examples, thinning the height of the plurality of thermoelectric rods and the overmold includes thinning at least some of the plurality of thermoelectric rods to differing heights. Additionally or alternatively, in some examples, thinning the height of the plurality of thermoelectric rods and the overmold includes creating a skewed top plane of the plurality of thermoelectric rods and the overmold. Additionally or alternatively, in some examples, the method further comprises: removing the overmold after the plurality of thermoelectric rods are bonded to the detector substrate. Additionally or alternatively, in some examples, the method further comprises: forming one or more detector pixels on the detector substrate. Additionally or alternatively, in some examples, forming the plurality of thermoelectric rods includes growing bulk semiconductor material.

A method for forming an integrated thermoelectric cooler is disclosed. The method can comprise: providing a first substrate; growing a plurality of thermoelectric rods on the first substrate; surrounding the plurality of thermoelectric rods in an overmold; providing a second substrate; bonding the plurality of thermoelectric rods to the second substrate; removing one or more of the first and second substrates; and bonding the plurality of thermoelectric rods to one or more of a system substrate and a detector substrate after the one or more of the first and second substrates are removed. Additionally or alternatively, in some examples, the method further comprises: thinning the plurality of thermoelectric rods and the overmold.

An integrated thermoelectric cooler is disclosed. The integrated thermoelectric cooler can comprise: an interposer, wherein a plurality of traces are disposed on the interposer; a detector substrate, wherein one or more detector pixels are disposed on the detector substrate; and a plurality of first thermoelectric rods thermally coupled to the substrate and the detector substrate, wherein the plurality of first thermoelectric rods directly contact a first surface of the interposer and the detector substrate. Additionally or alternatively, in some examples, the interposer includes one or more of aluminum nitride (AlN), aluminum dioxide ($Al_2O_3$), and silicon. Additionally or alternatively, in some examples, the detector substrate includes one or more of silicon, ceramic, and aluminum dioxide ($Al_2O_3$). Additionally or alternatively, in some examples, the plurality of first thermoelectric rods includes one or more of bismuth telluride (Bi2Te3), bismuth selenide (Bi2Se3), lead telluride (PbTe), bismuth antimony, silicon germanium (SiGe). Additionally or alternatively, in some examples, the integrated thermoelectric cooler further comprises: an overmold surrounding the plurality of first thermoelectric rods. Additionally or alternatively, in some examples, the overmold includes one or more of wax and epoxy. Additionally or alternatively, in some examples, the plurality of first thermoelectric rods comprises bulk semiconductor material. Additionally or alternatively, in some examples, a height of the plurality of thermoelectric rods is between 100-400 [tm. Additionally or alternatively, in some examples, a height of at least some of the plurality of first thermoelectric rods differs. Additionally or alternatively, in some examples, a top of at least some of the plurality of first thermoelectric rods includes angled edges. Additionally or alternatively, in some examples, the integrated thermoelectric cooler further comprises: a plurality of second thermoelectric rods disposed on a second surface, opposite the first surface, of the interposer.

A system is disclosed. The system can comprise: an interposer; a plurality of traces disposed on the interposer; an integrated circuit disposed on the interposer; one or more optical components disposed on the interposer; a detector substrate, wherein one or more detector pixels are disposed on the detector substrate; and a plurality of thermoelectric rods thermally coupled to the substrate and the detector substrate, wherein the plurality of thermoelectric rods directly contact the interposer and the detector substrate. Additionally or alternatively, in some examples, the system further comprises: an overmold surrounding the plurality of thermoelectric rods, wherein the overmold includes one or more of wax and epoxy.

A method for cooling a detector is disclosed. The method can comprise: operating the detector, the detector including one or more detector pixels disposed on a detector substrate; determining a temperature of the detector; in response to a determination that a magnitude of a difference between the temperature and a temperature set point is greater than a predetermined value, operating an integrated thermoelectric cooler including: applying and routing an electric current through a system interposer to the integrated thermoelectric cooler; transferring thermal heat from the detector substrate directly to a plurality of thermoelectric rods; and transferring the thermal heat from the plurality of thermoelectric rods directly to a system interposer.

Although the disclosed examples have been fully described with reference to the accompanying drawings, it is to be noted that various changes and modifications will become apparent to those skilled in the art. Such changes and modifications are to be understood as being included within the scope of the disclosed examples as defined by the appended claims.

What is claimed is:
1. An integrated thermoelectric cooler comprising:
an interposer, wherein a plurality of traces are disposed on the interposer;
an integrated circuit disposed on the interposer;
one or more optical components disposed on the interposer;
a detector substrate, wherein one or more detector pixels are disposed on the detector substrate; and
a plurality of first thermoelectric rods thermally coupled to the interposer and the detector substrate, wherein the plurality of first thermoelectric rods directly contact a first surface of the interposer and the detector substrate.

2. The integrated thermoelectric cooler of claim 1, wherein the interposer includes one or more of aluminum nitride (AlN), aluminum dioxide ($Al_2O_3$), and silicon.

3. The integrated thermoelectric cooler of claim 1, wherein the detector substrate includes one or more of silicon, ceramic, and aluminum dioxide ($Al_2O_3$).

4. The integrated thermoelectric cooler of claim 1, wherein the plurality of first thermoelectric rods includes one or more of bismuth telluride ($Bi_2Te_3$), bismuth selenide ($Bi_2Se_3$), lead telluride (PbTe), bismuth antimony, silicon germanium (SiGe).

5. The integrated thermoelectric cooler of claim 1, further comprising:
an overmold surrounding the plurality of first thermoelectric rods, wherein the overmold includes one or more of wax and epoxy.

6. The integrated thermoelectric cooler of claim 1, wherein the plurality of first thermoelectric rods comprises bulk semiconductor material.

7. The integrated thermoelectric cooler of claim 1, wherein a height of at least some of the plurality of first thermoelectric rods differs.

8. The integrated thermoelectric cooler of claim 1, wherein a top of at least some of the plurality of first thermoelectric rods includes angled edges.

9. The integrated thermoelectric cooler of claim 1, further comprising:
a plurality of second thermoelectric rods disposed on a second surface, opposite the first surface, of the interposer.

10. An integrated thermoelectric cooler, comprising:
a first detector substrate;
a first detector pixel of one or more detector pixels are disposed on the first detector substrate;
an interposer;
a plurality of traces disposed on the interposer;
an integrated circuit disposed on the interposer;
one or more optical components disposed on the interposer;
a plurality of first thermoelectric rods thermally coupled to the first detector substrate and the interposer, wherein:
the optical components include at least one of a detector array or a light source;
the first detector substrate defines a first surface;
the interposer defines a first interposer surface and a second interposer surface; and
the plurality of first thermoelectric rods directly contact the first surface of the first detector substrate and the first interposer surface.

11. The integrated thermoelectric cooler of claim 10, wherein:
the integrated thermoelectric cooler further comprises:
a second detector substrate;
a second detector pixel of the one or more detector pixels are disposed on the second detector substrate; and
a plurality of second thermoelectric rods thermally coupled to the interposer and the second detector substrate; wherein:
the second detector substrates defines a second surface of the second detector substrate; and
the plurality of second thermoelectric rods directly contact the second interposer surface and the second surface of the second detector substrate.

12. The integrated thermoelectric cooler of claim 11, further comprising:
an overmold surrounding the plurality of first thermoelectric rods and second thermoelectric rods, wherein the overmold includes one or more of wax or epoxy, thereby reducing chipping of the first thermoelectric rods and second thermoelectric rods.

13. The integrated thermoelectric cooler of claim 10, wherein heights of at least some of the plurality of first thermoelectric rods differ from one another.

14. The integrated thermoelectric cooler of claim 10, wherein a top of at least some of the plurality of first thermoelectric rods includes an angled edge.

15. An integrated thermoelectric cooler comprising:
an interposer with an interposer surface;
a detector substrate with a detector substrate surface;
a plurality of thermoelectric rods thermally coupled to the interposer and the detector substrate; and
a heat sink coupled to one of the interposer or detector substrate; wherein:
a plurality of traces disposed on the interposer;
one or more detector pixels disposed on the detector substrate; and
the plurality of thermoelectric rods directly contact an interposer surface and a detector substrate surface.

16. The integrated thermoelectric cooler of claim 15, further comprising:
an integrated circuit disposed on the interposer; and
one or more optical components disposed on the interposer, wherein the optical components include at least one of a detector array or a light source.

17. The integrated thermoelectric cooler of claim 15, wherein:
the tops of the plurality of thermoelectric rods form a plane;
the plane has a non-zero skew relative to the detector substrate surface.

18. The integrated thermoelectric cooler of claim 15, wherein:
a conductive material is disposed on the detector substrate surface; and
the conductive material electrically connects adjacent thermoelectric rods of the plurality of thermoelectric rods.

* * * * *